US 11,277,686 B2

(12) United States Patent
Kim et al.

(10) Patent No.: US 11,277,686 B2
(45) Date of Patent: Mar. 15, 2022

(54) ELECTRONIC DEVICE WITH AUDIO ZOOM AND OPERATING METHOD THEREOF

(71) Applicant: Samsung Electronics Co., Ltd., Suwon-si (KR)

(72) Inventors: Byeongjun Kim, Suwon-si (KR); Jaehyun Kim, Suwon-si (KR); Sangju Lee, Suwon-si (KR); Junsoo Lee, Suwon-si (KR); Kyoungho Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/988,042

(22) Filed: Aug. 7, 2020

(65) Prior Publication Data
US 2021/0044896 A1 Feb. 11, 2021

(30) Foreign Application Priority Data
Aug. 7, 2019 (KR) .................. 10-2019-0096166

(51) Int. Cl.
*G10L 25/51* (2013.01)
*G10L 21/0232* (2013.01)
(Continued)

(52) U.S. Cl.
CPC .......... *H04R 3/005* (2013.01); *G10L 21/0232* (2013.01); *G10L 25/51* (2013.01);
(Continued)

(58) Field of Classification Search
CPC ....... G10L 2021/02166; G10L 21/0208; G10L 21/0232; G10L 21/0356; G10L 25/51;
(Continued)

(56) References Cited

U.S. PATENT DOCUMENTS 8,644,517 B2   2/2014  Beaucoup
8,897,454 B2  11/2014  Jeong et al.
(Continued)

FOREIGN PATENT DOCUMENTS

JP   2004-289762 A     10/2004
KR   20080000478 A  *   1/2008
(Continued)

OTHER PUBLICATIONS

International Search Report dated Dec. 2, 2020, issued in International Application No. PCT/KR2020/010460.

*Primary Examiner* — Vivian C Chin
*Assistant Examiner* — Friedrich Fahnert
(74) *Attorney, Agent, or Firm* — Jefferson IP Law, LLP

(57) ABSTRACT

An electronic device is provided. The electronic device includes a camera, a plurality of microphones, at least one processor electrically coupled with the camera and the plurality of microphones. The at least one processor may acquire a video signal, based on a designated zoom level via the camera, acquire a plurality of audio signals respectively via the plurality of microphones while acquiring the video signal, identify a first signal characteristic of a first audio signal acquired via a first microphone and a second signal characteristic of a second audio signal acquired via a second microphone among the plurality of microphones, derive a control parameter for signal processing for the first audio signal and the second audio signal, based on the designated zoom level, the first signal characteristic, and the second signal characteristic, and perform audio signal processing including beamforming using the first audio signal and the second audio signal, based on the derived control parameter. Various other embodiments are also possible.

22 Claims, 11 Drawing Sheets

(51) Int. Cl.
*H03F 3/183* (2006.01)
*H04R 3/00* (2006.01)
*H04R 1/40* (2006.01)
*H04R 1/02* (2006.01)
*H03G 3/30* (2006.01)
*G10L 21/0216* (2013.01)

(52) U.S. Cl.
CPC ........... *H03F 3/183* (2013.01); *H03G 3/3005* (2013.01); *H04R 1/02* (2013.01); *H04R 1/406* (2013.01); *G10L 2021/02166* (2013.01); *H03F 2200/03* (2013.01); *H03G 2201/103* (2013.01); *H04R 2430/01* (2013.01); *H04R 2499/11* (2013.01)

(58) Field of Classification Search
CPC ..... G10L 25/57; H03F 2200/03; H03F 3/183; H03G 2201/103; H03G 3/00; H03G 3/3005; H03G 9/18; H04R 1/02; H04R 1/406; H04R 2410/01; H04R 2430/01; H04R 2499/11; H04R 3/005; H04R 3/04

USPC .......................................................... 381/92
See application file for complete search history.

(56) References Cited

U.S. PATENT DOCUMENTS

| | | |
|---|---|---|
| 8,908,880 B2 | 12/2014 | Zurek et al. |
| 9,210,503 B2 | 12/2015 | Avendano et al. |
| 2014/0029761 A1 | 1/2014 | Maenpaa et al. |
| 2015/0078571 A1 | 3/2015 | Kurylo et al. |
| 2016/0094910 A1* | 3/2016 | Vallabhan ............... H04R 3/005 381/92 |
| 2020/0366986 A1* | 11/2020 | Ono .................... G10L 21/0208 |

FOREIGN PATENT DOCUMENTS

| | | |
|---|---|---|
| KR | 10-2011-0099404 A | 9/2011 |
| KR | 10-1182017 B1 | 9/2012 |

\* cited by examiner

ELECTRONIC DEVICE WITH AUDIO ZOOM AND OPERATING METHOD THEREOF

CROSS-REFERENCE TO RELATED APPLICATION(S)

This application is based on and claims priority under 35 U.S.C. § 119(a) of a Korean patent application number 10-2019-0096166, filed on Aug. 7, 2019, in the Korean Intellectual Property Office, the disclosure of which is incorporated by reference herein in its entirety.

BACKGROUND

1. Field

The disclosure relates to an electronic device having an audio zoom function when shooting a video, and an operating method thereof.

2. Description of Related Art

An electronic device may be configured to perform various functions. Examples of the various functions include a data and voice communication function, a function for shooting a picture or video via a camera, a function of storing a voice, a function of reproducing a music file via a speaker system, a function of displaying an image or video, or the like.

Most particularly, the electronic device uses a camera to provide various functions for shooting a subject. A user may manipulate a control option of the camera to zoom in an image centering around a specific subject, or may shoot a desired image by manually/automatically adjusting a focus of the image or by using a face recognizer or the like. For example, the user may perform shooting by selectively using a front or rear camera of the electronic device according to a position of the subject, and, most particularly, may perform shooting by converting a shooting mode (a portrait mode or a landscape mode) according to a scene (e.g., a landscape, a person, and the like).

When the subject or the scene is shot by using the aforementioned various shooting techniques, a voice or sound generated by the subject may be stored by being captured via a microphone related to audio data collection, and an audio zoom function may be performed. Herein, the audio zoom function implies an audio signal processing technique in which a target signal is emphasized and an ambient signal is attenuated, so as to emphasize only a desired signal in association with a zoom level of the camera when shooting a video.

When performing an audio zoom function, the electronic device of the related art processes an audio signal by applying a pre-set fixed parameter to a zoom level of a camera. For example, the audio signal is processed in such a manner that 2 dB is applied to a 1× zoom level and 4 dB is applied to a 2× zoom level. However, since the electronic device of the related art performs audio zoom based only on the zoom level of the camera, problematically, it is difficult to actively cope with a change in a surrounding environment or a level or range of an ambient sound.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device having an audio zoom function with improved sound quality and an operating method thereof in such a manner that a characteristic of an audio input signal which is input via a plurality of microphones and a scene of a video shooting image are identified when shooting a video, various control parameters are derived based on the identifying, and the control parameters are applied to audio signal processing.

Additional aspects will be set forth in part in the description which follows and, in part, will be apparent from the description, or may be learned by practice of the presented embodiments.

Technical problems to be achieved in the document are not limited to the technical problems mentioned above, and other technical problems not mentioned herein can be clearly understood by those skilled in the art to which the disclosure pertains from the following descriptions.

In accordance with an aspect of the disclosure, an electronic device is provided. The electronic device includes a camera, a plurality of microphones, and at least one processor electrically coupled with the camera and the plurality of microphones. The at least one processor acquires a video signal, based on a designated zoom level via the camera, acquire a plurality of audio signals respectively via the plurality of microphones while acquiring the video signal, identify a first signal characteristic of a first audio signal acquired via a first microphone and a second signal characteristic of a second audio signal acquired via a second microphone among the plurality of microphones, derive a control parameter for signal processing for the first audio signal and the second audio signal, based on the designated zoom level, the first signal characteristic, and the second signal characteristic, and perform audio signal processing including beamforming using the first audio signal and the second audio signal, based on the derived control parameter.

In accordance with another aspect of the disclosure, an electronic device is provided. The electronic device includes a camera, a plurality of microphones, and at least one processor electrically coupled with the camera and the plurality of microphones. The at least one processor acquires a video signal, based on a designated zoom level via the camera, acquire a plurality of audio signals respectively via the plurality of microphones while acquiring the video signal, derive a control parameter for at least one of a beamforming effect, beam width, output amplification gain, noise reduction level, and filter gain applied to signal processing for the plurality of audio signal, based on the acquired video signal, at least one of a magnitude, frequency characteristic, Signal to Noise Ratio (SNR) of each of the plurality of audio signals, and the designated zoom level, and perform audio signal processing including beamforming using the plurality of audio signals, based on the derived control parameter.

In accordance with another aspect of the disclosure, a method of operating the electronic device is provided. The method includes acquiring a video signal, based on a designated zoom level via the camera, acquiring a plurality of audio signals respectively via the plurality of microphones while acquiring the video signal, identifying a first signal characteristic of a first audio signal acquired via a first microphone and a second signal characteristic of a second audio signal acquired via a second microphone among the plurality of microphones, deriving a control parameter for signal processing for the first audio signal and the second audio signal, based on the designated zoom level, the first signal characteristic, and the second signal characteristic, and performing audio signal processing including beamforming using the first audio signal and the second audio signal, based on the derived control parameter.

An electronic device according to various embodiments can provide a user with an audio zoom function having improved sound quality through audio signal processing based on various shooting conditions when shooting a video and a condition classified depending on a characteristic of an audio input signal, thereby maximizing user experience.

Other aspects, advantages and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
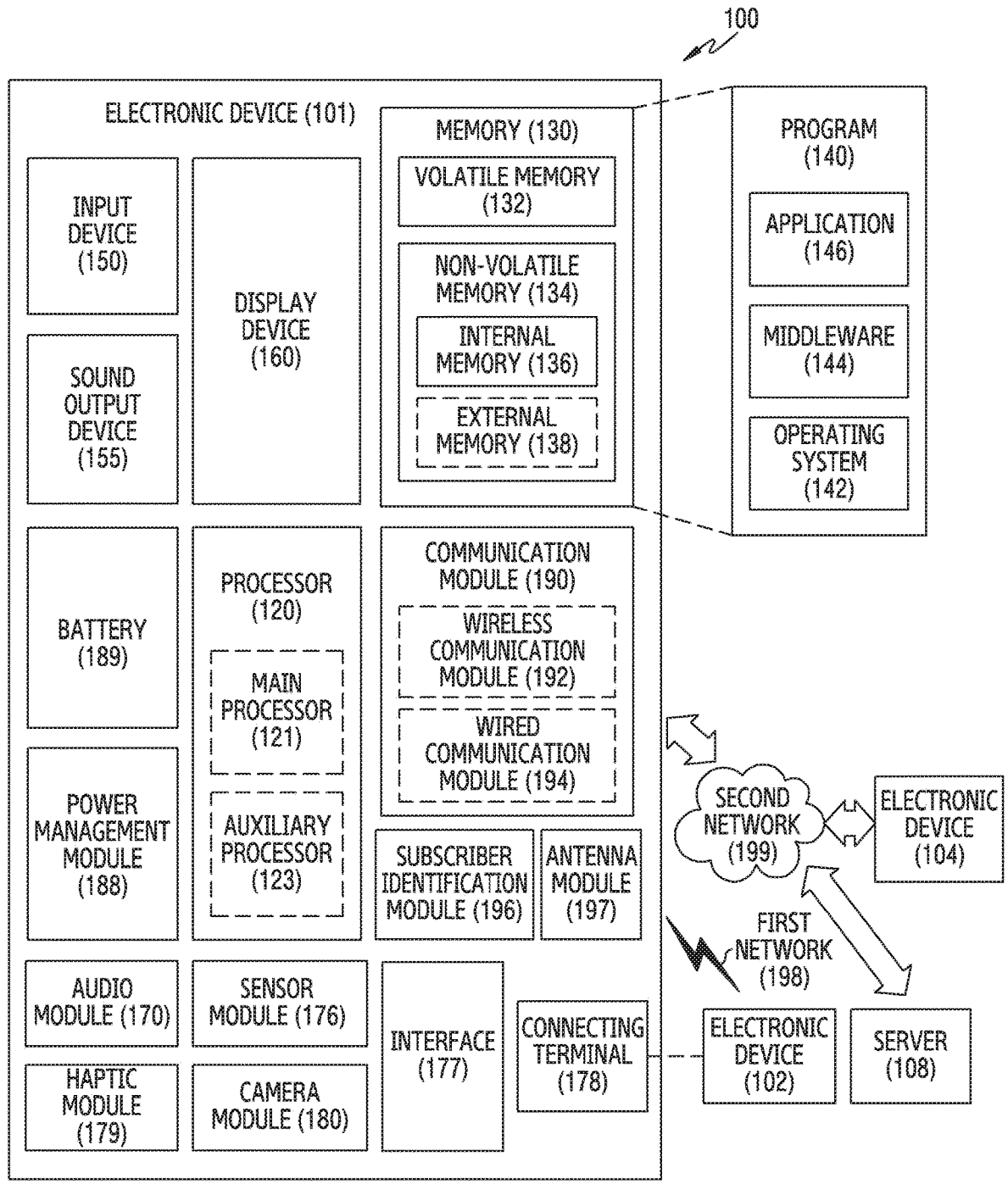
FIG. 1 illustrates an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
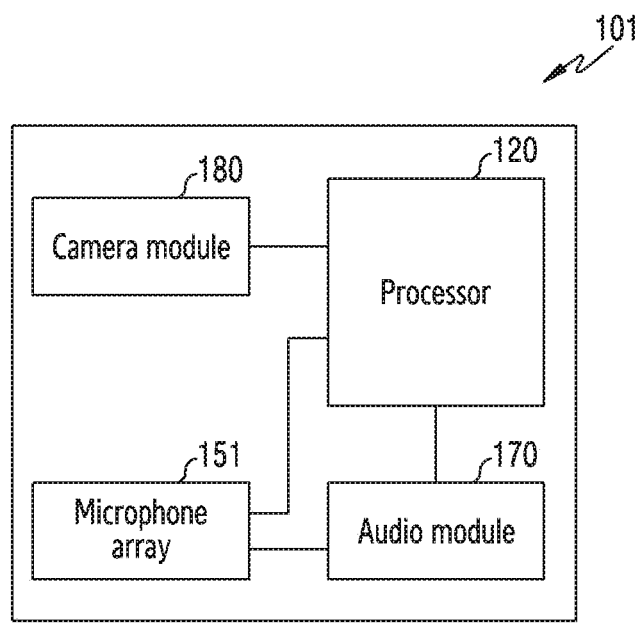
FIG. 2 is a block diagram of an electronic device according to an embodiment of the disclosure.

FIG. 2 is a block diagram of an electronic device according to an embodiment of the disclosure.

Referring to FIG. 2, an electronic device 101 may include a processor 120, au audio module 170, a camera module 180, and a microphone array 151. The microphone array 151 (which may be a constitution included in the input device 150 of FIG. 1) may include a plurality of microphones, and the plurality of microphones may convert external sounds into electrical audio signals and then output the audio signals. The plurality of microphones may receive sounds generated from at least one subject outside the electronic device and convert the sounds into audio signals when shooting a video via the camera module 180, and may output the converted audio signals to the processor 120 and/or the audio module 170.

The processor 120 of the electronic device 101 according to various embodiments may acquire a plurality of audio signals via the microphone array 151 when shooting the video via the camera module 180, and may analyze a shooting image and the plurality of acquired audio signals. In addition, the processor 120 may identify a characteristic of the analyzed plurality of audio signals, and may control audio signal processing, such as beamforming or the like achieved in the audio module 170 based on the identified signal characteristic. Therefore, according to an embodiment of the document, a more improved audio zoom function without signal distortion may be provided in association with a zoom level of the camera when shooting the video.

The processor 120 of the electronic device 101 according to an embodiment may detect a level of an input audio signal to determine a control parameter for audio signal processing.

The processor 120 of the electronic device 101 according to an embodiment may analyze a first SNR of the audio signal and a second SNR generated in a beamforming process to determine the control parameter for audio signal processing.

The processor 120 of the electronic device 101 according to an embodiment may analyze a scene of a shooting image of video signals acquired from the camera module 180 to determine the control parameter for audio signal processing.

The processor 120 of the electronic device 101 according to an embodiment may compare a frequency characteristic of the audio signal and a frequency characteristic of a signal which is before being output from the audio module 170 to determine the control parameter for audio signal processing.

The processor 120 of the electronic device 101 according to an embodiment may analyze a plurality of input signals to identify whether a plurality of microphone normally operate, thereby determining the control parameter for audio signal processing.

Figure 3:
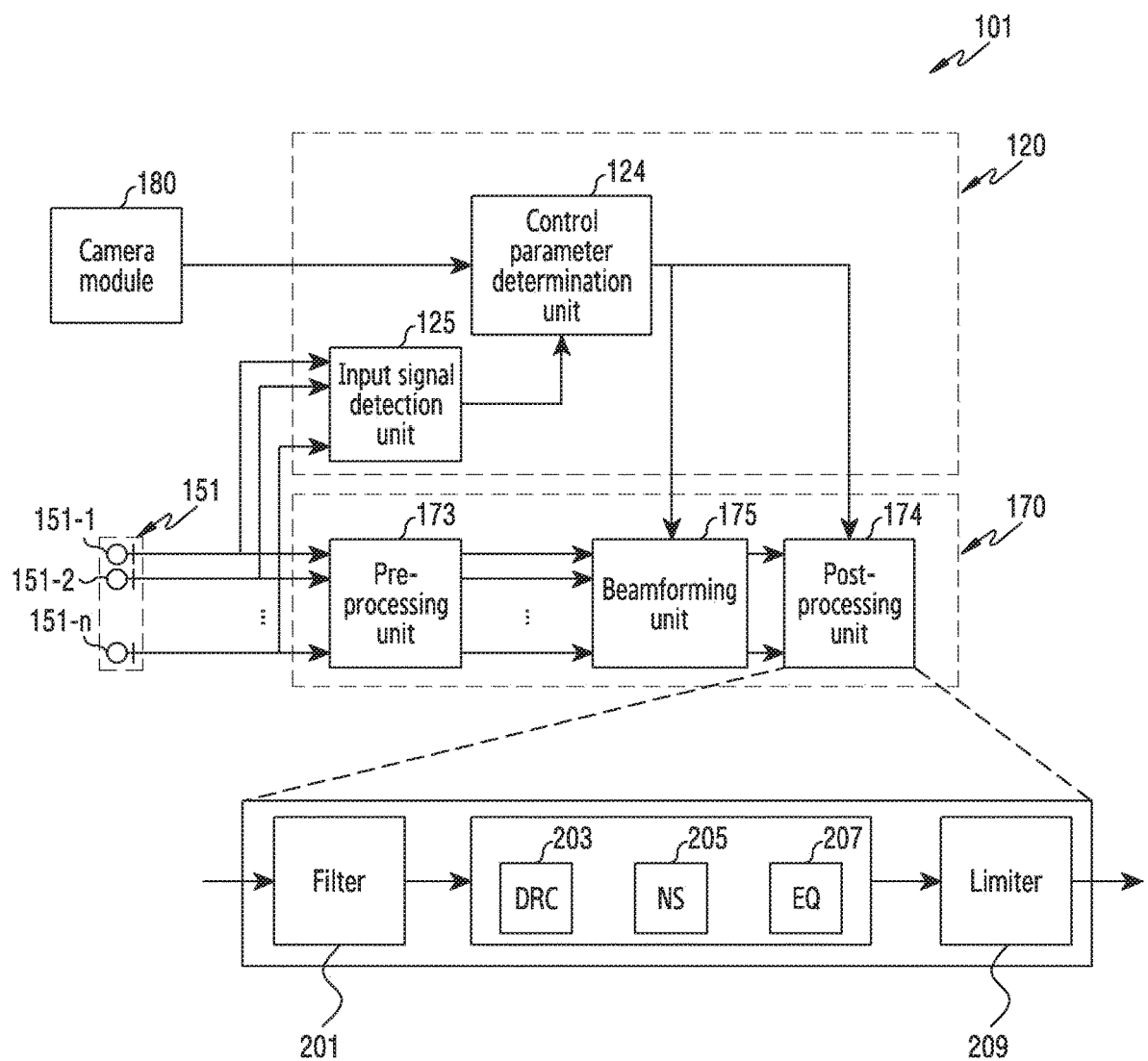
FIG. 3 is a block diagram illustrating a structure of an electronic device according to an embodiment of the disclosure.

FIG. 3 is a block diagram illustrating a structure of an electronic device according to an embodiment of the disclosure.

Referring to FIG. 3, the electronic device 101 may include the processor 120, the audio module 170, the camera module 180, and the microphone array 151.

The microphone array 151 may include a plurality of microphones. The plurality of microphones may include a first microphone 151-1, a second microphone 151-2, and an n-th microphone 151-$n$, which may be disposed spaced apart from each other on the electronic device. For example, the first microphone 151-1 may be disposed at a first position of the electronic device, and may convert a sound generated from the outside of the electronic device into an electrical audio signal to output a converted first audio signal to the processor 120 and/or the audio module 170. The second microphone 151-2 may be disposed at a second position different from the first position of the electronic device, and may convert a sound generated from the outside of the electronic device into an electrical audio signal to output a converted second audio signal to the processor 120 and/or the audio module 170.

In order to implement an audio zoom function, when shooting, the camera module 180 may perform zoom-in in which the user can increase a zoom level of a camera module so that an image screen is focused on a specific subject of interest or zoom-out in which the user can decrease the zoom level of the camera module so that a subject of a wider range is included in the image screen. For example, the camera module 180 or the processor 120 may change the zoom level of the camera module 180 in response to a touch event for the display device 160 of the electronic device. As another example, the camera module 180 may include a plurality of cameras. The plurality of cameras may include a standard camera, a wide-angle camera, and a telephoto camera. Each of the plurality of cameras may selectively adjust the zoom level. In addition, in order to implement the audio zoom function, the camera module 180 may transmit to the processor 120 a video signal including information on a zoom level and/or shooting image information.

According to various embodiments of the disclosure, the camera module 180 or the processor 120 may designate the zoom level of the camera module 180 in response to a user's input. In addition, the designated zoom level may be displayed on the display device 160.

The audio module 170 may include a pre-processing unit 173, a beamforming unit 175, and a post-processing unit 174. In an embodiment of the disclosure, the plurality of microphones 151 may acquire not only a target signal which is a target of processing but also an ambient signal or noise to be cancelled. The audio module 170 may perform a variety of processing on an audio signal to emphasize a signal acquired via the plurality of microphones and to cancel the noise. For example, the audio module 170 may separate audio signals, which are output from a plurality of microphones 151-1, 151-2, . . . , 151-n during video shooting, into a voice and a non-voice. In addition, the audio module 170 may perform a function of emphasizing an audio signal corresponding to a target signal of user's interest or canceling noise from the audio signal.

In addition, an audio output signal processed by the audio module 170 may be synthesized with information of an image shot by the camera module 180, and the synthesized image may be compressed in a predetermined format and then stored in the memory 130.

The pre-processing unit 173 of the audio module may input a plurality of audio signals output from the plurality of microphones 151-1, 151-2, . . . , 151-n, and thereafter may perform signal processing, such as magnitude adjustment, frequency adjustment, or the like of the plurality of audio signals to apply an audio effect to the plurality of audio signals via the beamforming unit and the post-processing unit.

The beamforming unit 175 of the audio module may process the audio signals such that the plurality of audio signals have directivity under the control of the processor 120. For example, the beamforming unit 175 may set an audio signal received in a specific direction to a target signal for the electronic device 101 and set an audio signal received in a direction other than the specific direction to an ambient signal, i.e., noise. In this manner, the target signal may be emphasized in the audio signal, and the noise may be attenuated in the audio signal.

The plurality of microphones 151-1, 151-2, . . . , 151-n included in the electronic device 101 may be disposed spaced apart from each other on the electronic device. Therefore, in order to set the audio signal received in the specific direction to the target signal, the beamforming unit 175 may be provided with distance information with respect to sound sources to form a sound beam corresponding to a reception range of a sound generated from a subject of interest which provides the target signal, and may process the audio signal so that the plurality of audio signals have directivity according to the sound beam. For example, the plurality of audio signals do not have the directivity when a sound beam width is set to 360 degrees, and the directivity of the plurality of audio signals may be increasing stronger when the sound beam width is decreased.

In addition, the beamforming unit 175 may distinguish the target signal and the ambient signal (or noise) in the plurality of audio signals and adjust a signal amplitude ratio between the target signal and the ambient signal (or noise) to adjust a beamforming effect level. For example, the beamforming unit 175 may increase an amplitude ratio of the target signal and the ambient signal to increase the beamforming effect level. Alternatively, the beamforming unit 175 may decrease the amplitude ratio of the target signal and the ambient signal to decrease the beamforming effect level.

The post-processing unit 174 of the audio module may include a filter 201, a Dynamic Range Controller (DRC) 203, a Noise Suppressor (NS) 205, an EQualizer (EQ) 207, and a limiter 209. In order to receive a plurality of beamformed audio signals and to maximize an audio zoom effect based on the zoom level of the camera module 180, post signal processing may be performed under the control of the processor 120. The most basic constitutions of the post-processing unit 174 are shown in FIG. 3, and other constitutions may be added or a processing order may be changed according to the purpose of signal processing.

In order to amplify strength of the audio signal, the filter 201 may reduce unnecessary low frequency band energy in the plurality of audio signals, and may include a low cut filter. The low cut filter may include a high pass filter or a low shelving filter.

The DRC 203 may adjust strengths of the plurality of audio signals in a dynamic range. The DRC 203 may adjust a parameter, such as an output amplification gain, an attack time, a release time, or the like, and may apply the adjusted parameter to the audio signal to perform signal processing so that a differentiated audio signal is generated in association with a camera zoom level.

The NS 205 may suppress noise which exists in the plurality of audio signals. In this case, noise cancelation may be signal processing for attenuating noise around a plurality of microphones or circuit noise or the like. The NS 205 may adjust a noise reduction level under the control of the processor to reduce noise in the audio signal.

The EQ 207 may perform signal processing, that is, frequency balancing, to correct sound quality of the audio signal so that relative strength is adjusted for each frequency band of the audio signal. As a hard limiter, the limiter 209 may process the audio signal so that a maximum signal level is controlled to a set level. For example, the limiter 209 may limit an output level so that an output audio signal level is within 0 dB of 16-bit or 24-bit digital.

According to various embodiments of the disclosure, the processor 120 may include an input signal detection unit 125 and a control parameter determination unit 124, and may receive a plurality of audio signals from the plurality of microphones 151-1, 151-2, . . . , 151-n apart from the audio module 170 to detect an audio signal and identify a characteristic of the audio signal, and may control the audio module 170 to generate an audio output signal having an audio zoom effect in association with a zoom level which is input from the camera module. In addition, the processor 120 may identify a characteristic of an environment for acquiring video and audio signals and a characteristic of a plurality of audio signals based on the environment, and may determine a control parameter for audio signal processing performed by the audio module 170, based on the identified characteristic.

The input signal detection unit 125 may receive the plurality of audio signals from the plurality of microphones 151-1, 151-2, . . . , 151-n to acquire the audio signal and detect a level of the audio signal. The level implies a magnitude of the audio signal, i.e., an amplitude of the audio signal. For example, the input signal detection unit 125 may detect a first audio signal acquired via a first microphone, identify a magnitude of the first audio signal, detect a second audio signal acquired via a second microphone, and identify a magnitude of the second audio signal.

The control parameter determination unit 124 may receive a zoom level from the camera module 180 and receive a magnitude of each of a plurality of audio signals from the input signal detection unit 125 to determine a control parameter related to audio signal processing based on the zoom level and the magnitude of each of the plurality of audio signals, and may deliver a control signal to the beamforming unit 175 and post-processing unit 174 in the audio module 170 to control audio signal processing.

According to an embodiment of the disclosure, the control parameter determination unit 124 may identify whether the magnitude of each of the plurality of audio signals exceeds a pre-set threshold. The threshold may be pre-set as a plurality of thresholds, i.e., a first threshold, a second threshold greater than the first threshold, and an n-th threshold greater than an (n−1)-th threshold. In addition, the control parameter determination unit 124 may determine an output amplification gain level applied to the DRC 203 of the post-processing unit 174 according to whether the magnitude of each of the plurality of audio signals exceeds the first threshold, the second threshold, . . . , or the n-th threshold. For example, the output amplification gain level may be applied as a pre-set first level to an audio signal exceeding the first threshold, and the output amplification gain level may be applied to an audio signal exceeding the second threshold as a pre-set second level lower than the first level. It may be applied by stepwisely decreasing an output amplification gain according to whether the magnitude of the audio signal exceeds the first threshold, the second threshold, . . . , or the n-th threshold. In this case, distortion of an output signal may be reduced. Alternatively, the second level lower than the first level may be collectively applied to the audio signal exceeding the second threshold.

In addition, the control parameter determination unit 124 may change a filter gain applied to the filter 201 of the post-processing unit 174 according to whether the magnitude of each of the plurality of audio signals exceeds the first threshold, the second threshold, . . . , or the n-th threshold. The filter gain is a low shelving filter gain which implies an absolute value of an energy reduction ratio (a value in unit of decibels having a minus value) of a signal below a cutoff frequency against the existing signal energy. For example, the filter gain may be configured to be increased stepwisely according to whether the magnitude of the audio signal exceeds the first threshold, the second threshold, . . . , or the n-th threshold. In this case, distortion of an output signal may be reduced. In this case, a headroom of the audio signal may be secured.

In addition, the control parameter determination unit 124 may change the noise reduction level applied to the NS 205 of the post-processing unit 174 according to whether the magnitude of each of the plurality of audio signals exceeds the first threshold, the second threshold, . . . , or the n-th threshold. The noise reduction level implies an absolute value of a noise energy reduction ratio (a value in unit of decibels having a minus value) against the existing signal energy. For example, the noise reduction level may be applied as a pre-set first level to an audio signal exceeding the first threshold, and the noise reduction level may be applied as a pre-set second level lower than the first level to an audio signal exceeding the second threshold. The noise reduction level may be applied by being decreased stepwisely according to whether the magnitude of the audio signal exceeds the first threshold, the second threshold, . . . , or the n-th threshold. In this case, distortion of an output signal may be reduced. Alternatively, the second level lower than the first level may be collectively applied to the audio signal exceeding the second threshold.

The control parameter determination unit 124 may transfer a determined control parameter, that is, an output amplification gain level applied to the DRC 203, a filter gain applied to the filter 201, or a noise reduction level applied to the NS 205 to a corresponding constitution of the post-processing unit 174 as a control signal, thereby controlling audio signal processing.

Figure 4:
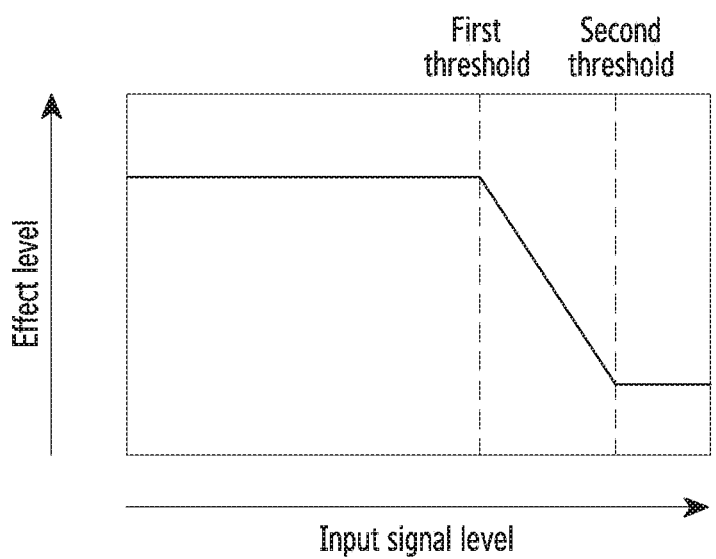
FIG. 4 is a graph illustrating a relationship between an input signal level and a control parameter effect level according to an embodiment of the disclosure.

FIG. 4 is a graph illustrating a relationship between an input signal level and a control parameter effect level according to an embodiment of the disclosure.

Referring to FIG. 4, a horizontal axis of the illustrated graph corresponds to a magnitude of one of a plurality of audio signals received from a plurality of microphones, and a vertical axis refers to an effect level representing a magnitude of a control parameter determined in a control parameter determination unit. The control parameter may include an output amplification gain level applied to the DRC 203, a filter gain applied to the filter 201, or a noise reduction level applied to the NS 205.

The graph of FIG. 4 may represent an output amplification gain level applied to the DRC 203 or a noise reduction level applied to the NS 205, and a magnitude of an input audio signal and an effect level for signal processing, that is, the output amplification gain level applied to the DRC 203 or the noise reduction level applied to the NS 205, may have a negative correlation. In addition, a collective effect level may be determined according to whether an input audio signal exceeds a pre-set threshold. For example, the effect level may be collectively applied to an audio signal not exceeding a first threshold as a first level, and the effect level may be collectively applied to an audio signal exceeding a second threshold greater than the first threshold as a second level lower than the first level. In addition, a shape of the graph may not be applied to a filter gain applied to the filter 201. For example, when the magnitude of the audio signal is a value between the first threshold and the second threshold, the magnitude of the input audio signal and the filter gain applied to the filter 201 may have a positive correlation. In addition, the graph is an example of an effect level applied to audio signal processing, and without being limited thereto, the disclosure may configure an appropriate effect level according to an audio signal characteristic to realize an audio zoom function.

Figure 5:
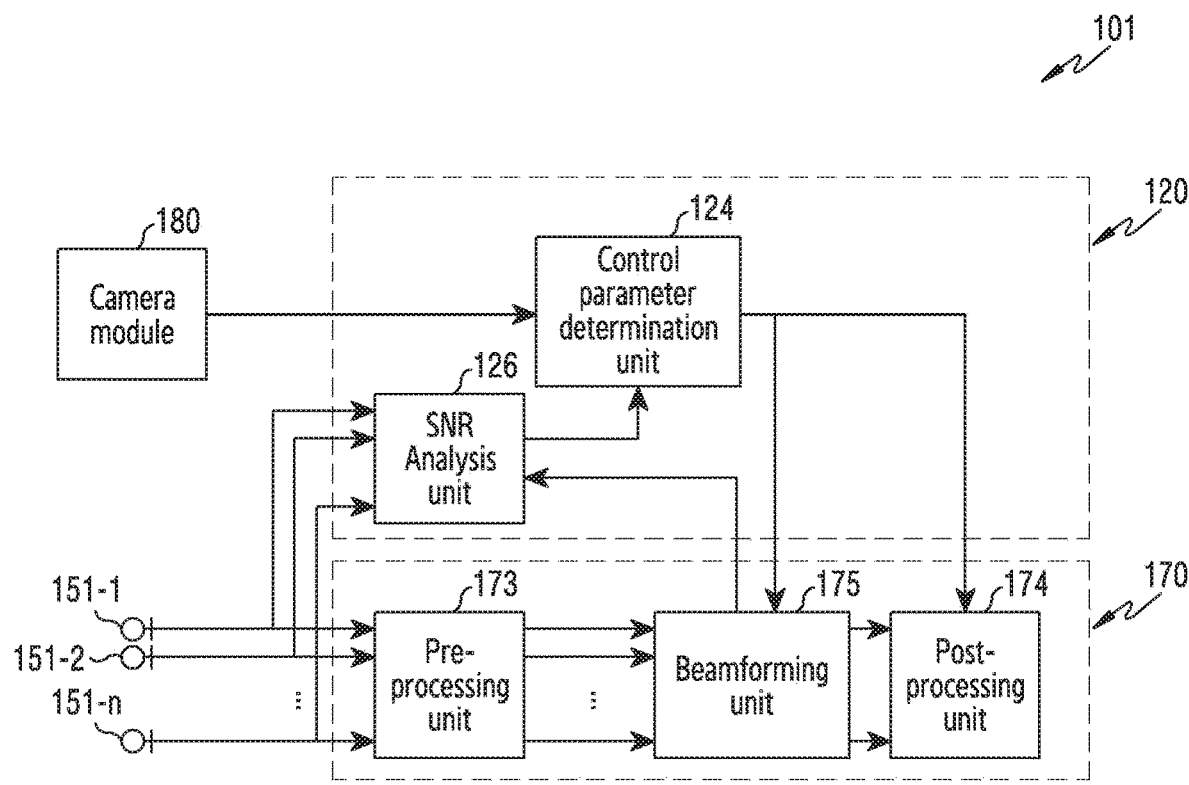
FIG. 5 is a block diagram illustrating a structure of an electronic device according to an embodiment of the disclosure.
Figure 6A:
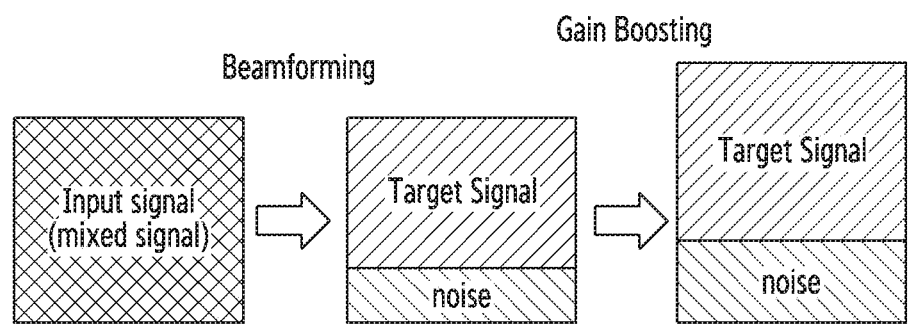
FIG. 6A illustrates an output signal in which an output amplification gain based on a zoom level is applied to an input signal having a high Signal to Noise Ratio (SNR) according to an embodiment of the disclosure.
Figure 6B:
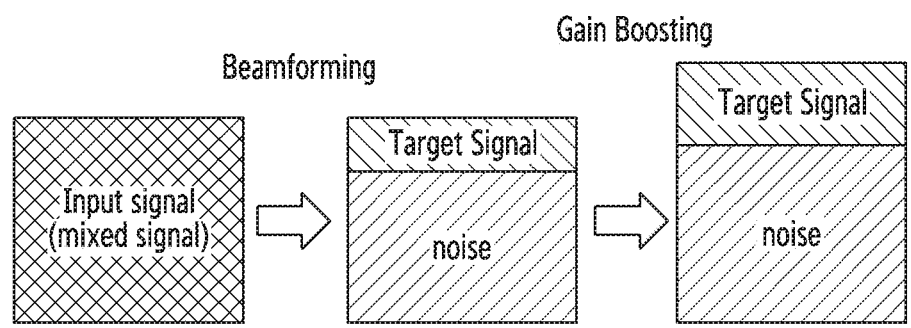
FIG. 6B illustrates an output signal in which an output amplification gain based on a zoom level is applied to an input signal having a low SNR according to an embodiment of the disclosure.

FIG. 5 is a block diagram illustrating a structure of an electronic device according to an embodiment of the disclosure. FIG. 6A illustrates an output signal in which an output amplification gain based on a zoom level is applied to an input signal having a high SNR according to an embodiment of the disclosure, and FIG. 6B illustrates an output signal in which an output amplification gain based on a zoom level is applied to an input signal having a low SNR according to an embodiment of the disclosure. In the description of FIG. 5, the same description as that described with reference to FIG. 3 will be omitted.

Referring to FIG. 5, the processor 120 of the electronic device 101 according to an embodiment may further include an SNR analysis unit 126. The SNR analysis unit 126 may receive an audio signal output from a plurality of microphones to determine a first SNR for the audio signal, and may receive a second SNR for an audio signal, determined by the beamforming unit. In addition, the SNR analysis unit 126 may transfer the first SNR and the second SNR to the control parameter determination unit. Herein, a Signal to Noise Ratio (SNR) is a numerical value expressing an amount of noise accompanying a signal. The SNR is expressed as a signal to noise ratio in unit of dB. The higher the numerical value, the smaller the noise.

The first SNR may be determined by the SNR analysis unit 126, and, in general, may be a ratio of strength of a signal having information and strength of noise corresponding to noise around the plurality of microphone or circuit noise. In addition, the second SNR may be determined by the beamforming unit 175, and may be calculated in such a manner that an audio signal received in a target direction for beamforming, that is, a target signal, is set as a signal for calculating the second SNR, and an audio signal received in a direction other than the target direction, i.e., an ambient signal, is set as noise for calculating the second SNR.

Referring to FIG. 6A and FIG. 6B, it is mimetically illustrated a case where an input audio signal is separated into a target signal and an ambient signal (i.e., noise) through beamforming processing, and thereafter the audio signal is amplified by an output amplification gain based on a zoom level of a camera module. When the second SNR is high as shown in FIG. 6A, since the target signal is increased without a significant increase in the ambient signal, an output signal having a good zoom effect may be generated. On the other hand, when the second SNR is low as shown in FIG. 6B, since only an undesired ambient sound is increased, a distorted output signal may be generated.

Therefore, according to an embodiment of the disclosure, the control parameter determination unit 124 may receive the first SNR and/or the second SNR from the SNR analysis unit 126. The control parameter determination unit 124 may add an output amplification gain level applied to the DRC 203 according to a zoom level of the camera module under a condition in which the received first SNR and/or second SNR exceeds a set reference value. The output amplification gain level applied to the DRC 203 may be decreased stepwise according to values of the first SNR and/or the second SNR under a condition in which the received first SNR and/or second SRN is less than or equal to the set reference value.

In addition, the control parameter determination unit 124 may stepwise decrease the beamforming effect level according to values of the first SNR and/or second SNR under the condition that the received first SNR and/or second SNR is less than or equal to the set reference value, or may bypass signal processing of the beamforming unit 175.

Figure 7:
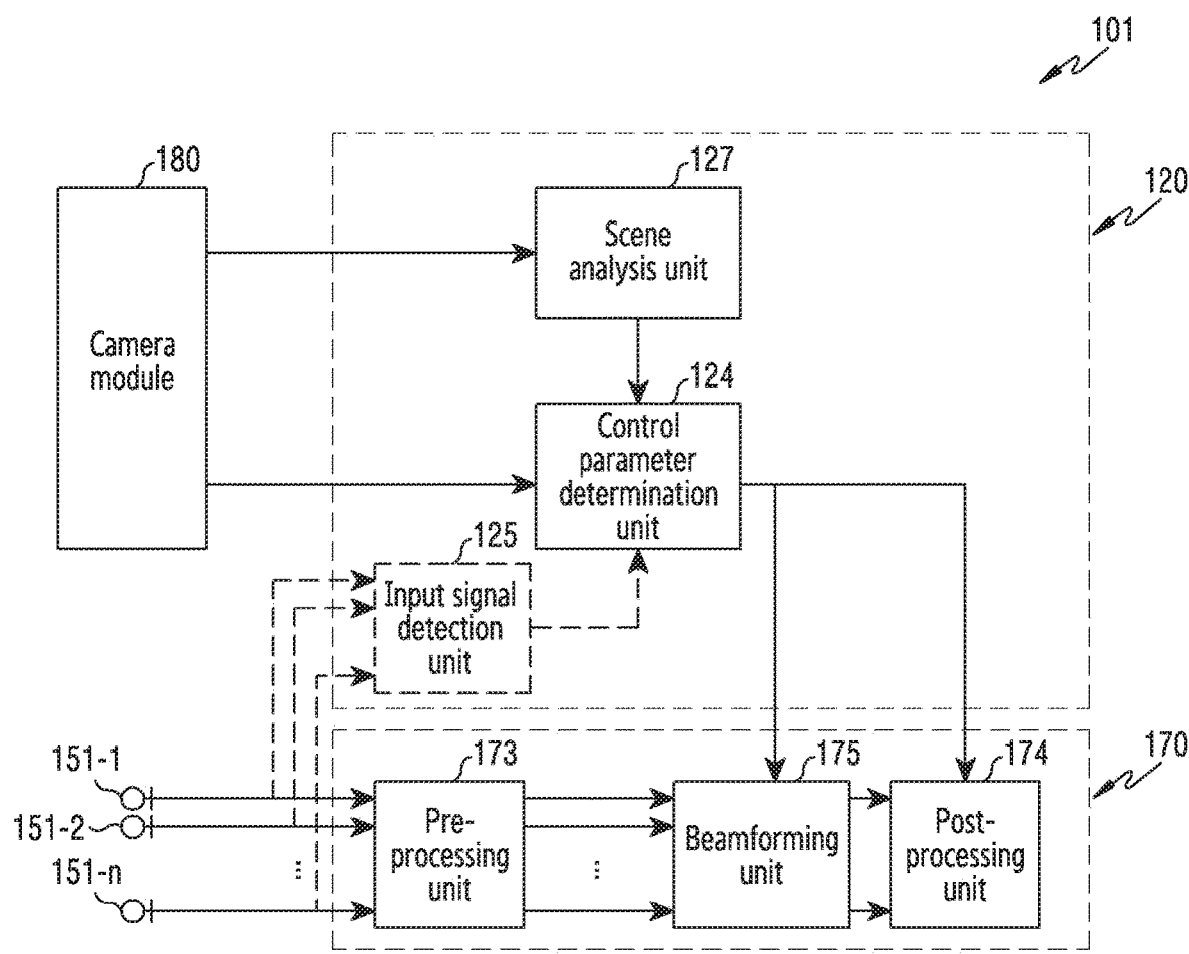
FIG. 7 is a block diagram illustrating a structure of an electronic device according to an embodiment of the disclosure.
Figure 8:
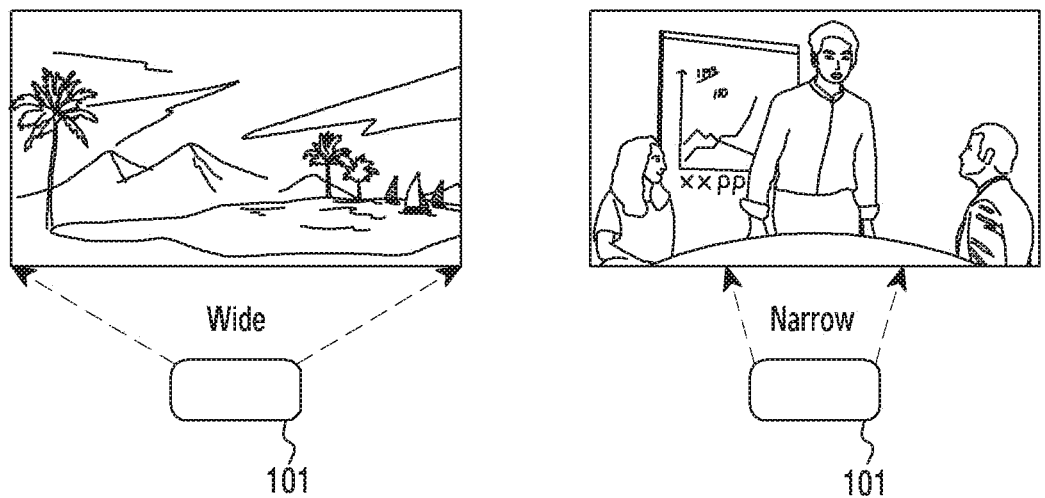
FIG. 8 illustrates a scene of a shooting image according to an embodiment of the disclosure.

FIG. 7 is a block diagram illustrating a structure of an electronic device according to an embodiment of the disclosure, and FIG. 8 illustrates a scene of a shooting image according to an embodiment of the disclosure. In the description of FIG. 7, the same description as that described with reference to FIG. 3 will be omitted.

Referring to FIG. 7, the processor of the electronic device according to an embodiment may further include a scene analysis unit 127. The scene analysis unit 127 may receive a video signal acquired from the camera module 180 to identify a shooting image scene in the video signal. For example, the scene analysis unit 127 may identify whether the shooting image scene is a landscape image or a person image according to whether a person is included. When the shooting image scene is the person image, the scene analysis unit 127 may identify the number of persons. As another example, the scene analysis unit 127 may identify what object is included in the shooting image scene or whether the object is in motion. Specifically, whether the shooting image scene is a food image which mainly includes food may be identified. In this case, whether the food is boiling may be additionally identified.

The control parameter determination unit 124 of the electronic device according to an embodiment may determine a control parameter for controlling the beamforming unit 175 and/or the post-processing unit 174, based on scene information identified by the scene analysis unit 127.

Referring to FIG. 8, the control parameter determination unit 124 may provide control such that a sound beam width generated by the beamforming unit 175 is set to be wide, based on identification information indicating that a shooting scene is the landscape image. In addition, the control parameter determination unit 124 may provide control such that the sound beam width generated by the beamforming unit 175 is set to be narrow with respect to a person who speaks, based on identification information indicating that the shooting scene is a speaking person image.

The sound beam width implies a reception angle of a sound beam formed in a direction of a subject of interest, i.e., a widthwise direction range formed by the reception angle. The sound beam represents directivity to the subject of interest. When the reception angle is increased, a reception range is also increased, and thus a sound may be received in a wider range. When the reception angle is decreased, the reception range is decreased, and thus a sound to be generated may be received in a concentration manner in a narrow range.

In addition, based on identification information regarding an object included in the shooting image scene or identification information regarding whether the object is in motion, the control parameter determination unit 124 may emphasize a sound generated from the object or generated due to a motion of the object as a target signal, and may increase a beamforming effect level so that an ambient signal is further attenuated. For example, based on identification information indicating that food is included in a shooting scene and the food is boiling, the control parameter determination unit 124 may emphasize a target signal corresponding to a food sound and may increase a beamforming effect level so that an ambient signal is further attenuated. Based on identification information indicating that food is included in the shooting scene and the food is finished food which is not in motion, the control parameter determination unit 124 may decrease a beamforming effect level so that an ambient signal is recorded properly.

In addition, based on that the shooting scheme is a person image and based on identification information regarding the number of persons, the control parameter determination unit 124 may differently set a beamforming effect level and/or a sound beam width.

Figure 9:
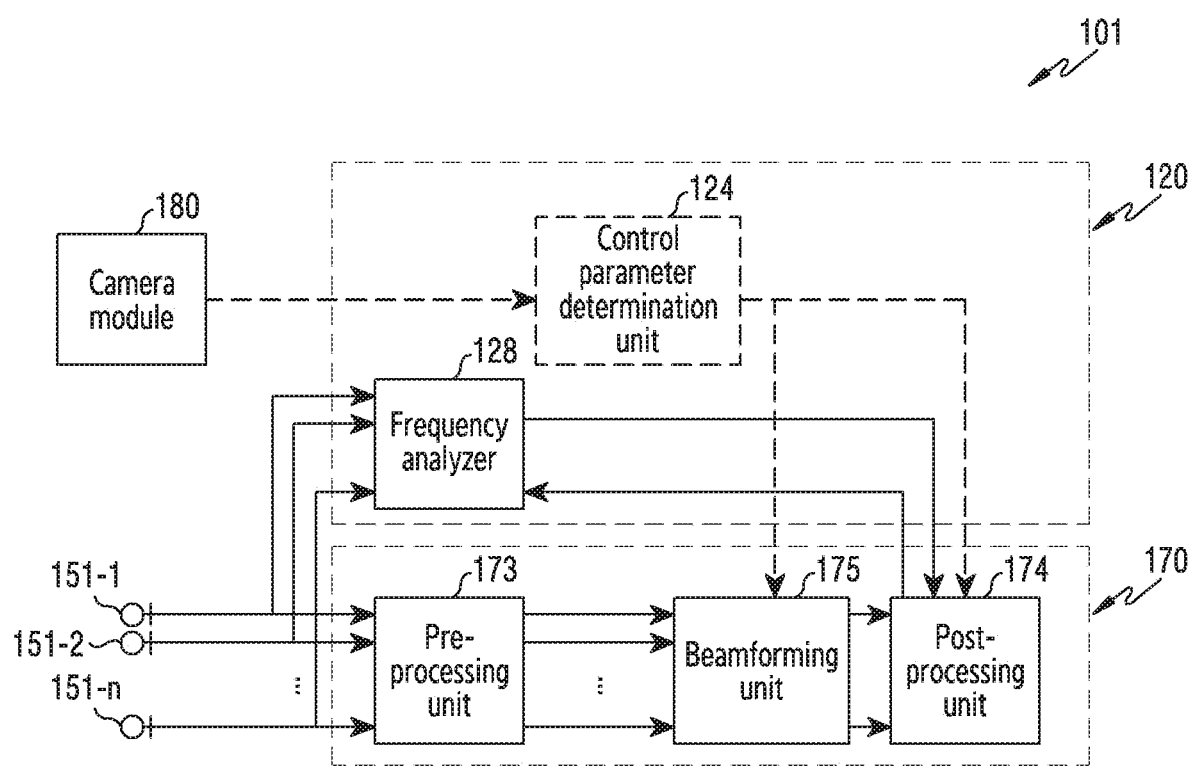
FIG. 9 is a block diagram illustrating a structure of an electronic device according to an embodiment of the disclosure.

FIG. 9 is a block diagram illustrating a structure of an electronic device according to an embodiment of the disclosure. In the description of FIG. 9, the same description as that described with reference to FIG. 3 will be omitted.

Referring to FIG. 9, the processor of the electronic device according to an embodiment may further include a frequency analyzer 128. The frequency analyzer 128 may receive a plurality of audio signals input from a plurality of microphones and a plurality of audio signals which are before being output from a post-processing unit, and may compare a frequency characteristic of the plurality of audio signals input from the plurality of microphones 151-1 and 151-2, . . . , 151-n and a frequency characteristic of the plurality of audio signals which are before being output from the post-processing unit 174. For example, the plurality of audio signals which are before being output from the post-processing unit 174 may be a plurality of audio signals after being subjected to signal processing via the DRC 203. In addition, the frequency analyzer 128 may transmit a control signal so that the EQ 207 of the post-processing unit 174 performs frequency balancing, based on the aforementioned comparison. In this case, when the DRC 203 of the post-processing unit 174 processes an audio signal, it is possible to prevent a phenomenon in which the audio signal is distorted since energy of the audio signal is boosted to be concentrated on a higher frequency.

As an embodiment of the disclosure, the input signal detection unit 125 of FIG. 3 may identify whether the plurality of audio signals input from the plurality of microphones are abnormal. An example of the abnormal case may be a case where a magnitude of an audio signal is a very small value less than a pre-designated reference value. The control parameter determination unit 124 may bypass signal processing of the beamforming unit 175, based on identifying that some of the plurality of audio signals are abnormal.

Figure 10:
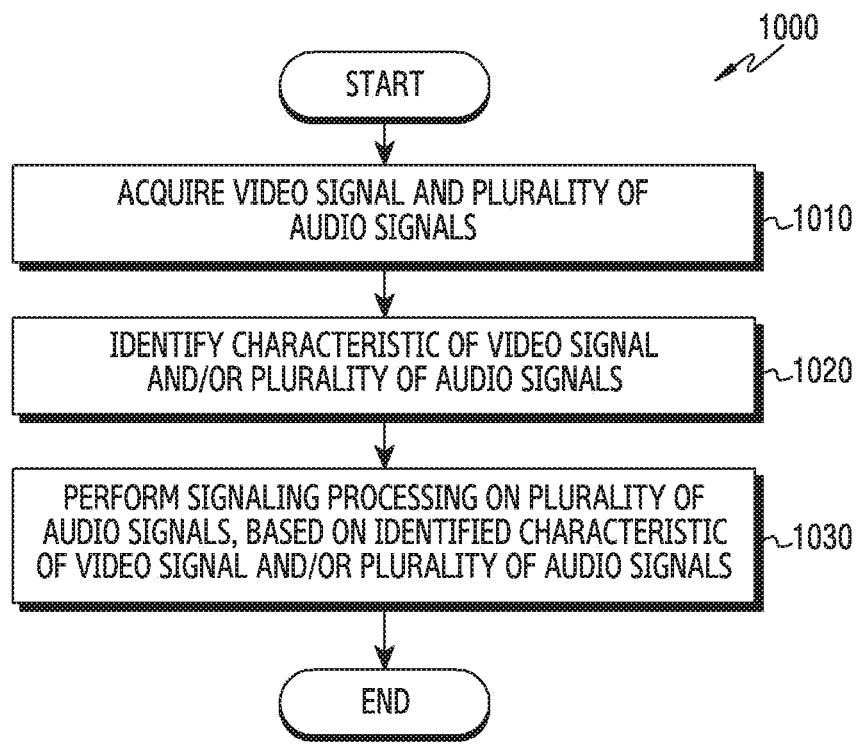
FIG. 10 is a flowchart illustrating an operation of an electronic device having an audio zoom function according to an embodiment of the disclosure.

FIG. 10 is a flowchart 1000 illustrating an operation of an electronic device having an audio zoom function according to an embodiment of the disclosure. In a method of FIG. 10, an audio signal is processed to have an audio zoom effect in association with a zoom level of a camera module. The operation procedure of FIG. 10 may be controlled by the processor 120 of FIG. 2.

Referring to FIG. 10, in operation 1010, the electronic device may acquire a plurality of audio signals via the plurality of microphones 151-1, 151-2, . . . , 151-n, and may acquire a video signal including information on a zoom level and/or shooting image information via the camera module 180.

In operation 1020, the electronic device may receive a plurality of audio signals from the plurality of microphones 151-1, 151-2, . . . , 151-n apart from the audio module 170 to detect an audio signal and identify a characteristic of the audio signal, and may receive a video signal from the camera module 180 to identify a characteristic of the video signal.

In operation 1030, based on the identified characteristic of the plurality of audio signals and the identified characteristic of the video signal, the electronic device may determine a control parameter for processing of the plurality of audio signals, and may perform signal processing on the plurality of audio signals.

According to an embodiment of the disclosure, in operation 1020, the electronic device may identify a magnitude of the plurality of audio signals. For example, a first audio signal acquired via a first microphone may be detected to identify a magnitude of the first audio signal, and a second audio signal acquired via a second microphone may be detected to identify a magnitude of the second audio signal. In addition, the electronic device may identify whether a magnitude of each of the plurality of audio signals exceeds a pre-set threshold. The threshold may be pre-set as a plurality of thresholds, i.e., a first threshold, a second threshold greater than the first threshold, and an n-th threshold greater than an (n−1)-th threshold.

In addition, in operation 1030, the electronic device may determine an output amplification gain level applied to the DRC 203 of the post-processing unit 174 according to whether the magnitude of each of the plurality of audio signals exceeds the first threshold, the second threshold, . . . , or the n-th threshold. For example, the output amplification gain level may be applied as a pre-set first level to an audio signal exceeding the first threshold, and the output amplification gain level may be applied to an audio signal exceeding the second threshold as a pre-set second level lower than the first level. It may be applied by stepwisely decreasing an output amplification gain according to whether the magnitude of the audio signal exceeds the first threshold, the second threshold, . . . , or the n-th threshold. In this case, distortion of an output signal may be reduced. Alternatively, the second level lower than the first level may be collectively applied to the audio signal exceeding the second threshold.

In addition, in operation 1030, the electronic device may change a filter gain applied to the filter 201 of the post-processing unit 174 according to whether the magnitude of each of the plurality of audio signals exceeds the first threshold, the second threshold, . . . , or the n-th threshold. The filter gain is a low shelving filter gain which implies an absolute value of an energy reduction ratio (a value in unit of decibels having a minus value) of a signal below a cutoff frequency against the existing signal energy. For example, the filter gain may be configured to be increased stepwisely according to whether the magnitude of the audio signal exceeds the first threshold, the second threshold, . . . , or the n-th threshold. In this case, distortion of an output signal may be reduced. In this case, a headroom of the audio signal may be secured.

In addition, in operation 1030, the electronic device may change the noise reduction level applied to the NS 205 of the post-processing unit 174 according to whether the magnitude of each of the plurality of audio signals exceeds the first threshold, the second threshold, . . . , or the n-th threshold. The noise reduction level implies an absolute value of a noise energy reduction ratio (a value in unit of decibels having a minus value) against the existing signal energy. For example, the noise reduction level may be applied as a pre-set first level to an audio signal exceeding the first threshold, and the noise reduction level may be applied as a pre-set second level lower than the first level to an audio signal exceeding the second threshold. The noise reduction level may be applied by being decreased stepwisely according to whether the magnitude of the audio signal exceeds the first threshold, the second threshold, . . . , or the n-th threshold. In this case, distortion of an output signal may be reduced. Alternatively, the second level lower than the first level may be collectively applied to the audio signal exceeding the second threshold.

In operation 1030, the electronic device may transfer a determined control parameter, that is, an output amplification gain level applied to the DRC 203, a filter gain applied to the filter 201, or a noise reduction level applied to the NS 205 to a corresponding constitution of the post-processing unit 174 as a control signal, thereby controlling audio signal processing so that a plurality of audio signals have an audio zoom effect in association with a zoom level.

According to an embodiment of the disclosure, in operation 1002, the electronic device may receive an audio signal output from a plurality of microphones to determine a first SNR for the audio signal, and may receive a second SNR for an audio signal, determined by the beamforming unit 175. The first SNR may be determined by the SNR analysis unit 126, and, in general, may be a ratio of strength of a signal having information and strength of noise corresponding to noise around the plurality of microphone or circuit noise. In addition, the second SNR may be determined by the beamforming unit 175, and may be calculated in such a manner that an audio signal received in a target direction for beamforming, that is, a target signal, is set as a signal for calculating the second SNR, and an audio signal received in a direction other than the target direction, i.e., an ambient signal, is set as noise for calculating the second SNR.

In addition, in operation 1020, the electronic device may identify whether the first SNR and/or the second SNR exceeds a set reference value.

In operation 1030, the electronic device may identify whether the first SNR and/or the second SNR exceeds the set reference value to increase an output amplification gain level applied to the DRC 203 according to a zoom level of a camera module, and may identify whether the first SNR and/or the second SNR is less than or equal to the set reference value to stepwisely decrease the output amplification gain level applied to the DRC 203 according to values of the first SNR and/or the second SNR.

In addition, in operation 1030, the electronic device may identify whether the first SNR and/or the second SNR is less than or equal to the set reference value to stepwisely decrease the beamforming effect level or may bypass signal processing of the beamforming unit 175.

According to an embodiment of the disclosure, in operation 1020, the electronic device may receive a video signal acquired from the camera module 180 to identify a shooting image scene in the video signal. For example, the electronic device may identify whether the shooting image scene is a landscape image or a person image according to whether a person is included. When the shooting image scene is the person image, the scene analysis unit 127 may identify the number of persons. As another example, the scene analysis unit 127 may identify whether the shooting image scene is a food image which mainly includes food. In this case, whether the food is boiling may be additionally identified.

In operation 1030, the electronic device may determine a control parameter for controlling the beamforming unit 175 and/or the post-processing unit 174, based on identified scene information.

Referring to FIG. 10, in operation 1030, the electronic device may provide control such that a sound beam width generated by the beamforming unit 175 is set to be wide, based on identification information indicating that a shooting scene is the landscape image. In addition, the control parameter determination unit 124 may provide control such that the sound beam width generated by the beamforming unit 175 is set to be narrow with respect to a person who speaks, based on identification information indicating that the shooting scene is a speaking person image.

The sound beam width implies a reception angle of a sound beam formed in a direction of a subject of interest, i.e., a widthwise direction range formed by the reception angle. The sound beam represents directivity to the subject of interest. When the reception angle is increased, a reception range is also increased, and thus a sound may be received in a wider range. When the reception angle is decreased, the reception range is decreased, and thus a sound to be generated may be received in a concentration manner in a narrow range.

In addition, in operation 1030, based on identification information regarding an object included in the shooting image scene or identification information regarding whether the object is in motion, the electronic device may emphasize a sound generated from the object or generated due to a motion of the object as a target signal, and may increase a beamforming effect level so that an ambient signal is further attenuated. For example, in operation 1030, based on identification information indicating that food is included in a shooting scene and the food is boiling, the electronic device may emphasize a target signal corresponding to a food sound and may increase a beamforming effect level so that an ambient signal is further attenuated. Based on identification information indicating that food is included in the shooting scene and the food is finished food which is not in motion, the electronic device may decrease a beamforming effect level so that an ambient signal is recorded properly.

In addition, in operation 1030, based on that the shooting scheme is a person image and based on identification information regarding the number of persons, the electronic device may differently set a beamforming effect level and/or a sound beam width.

According to an embodiment of the disclosure, in operation 1020, the electronic device may receive a plurality of audio signals input from a plurality of microphones and a plurality of audio signals which are before being output from a post-processing unit, and may compare a frequency characteristic of the plurality of audio signals input from the plurality of microphones 151-1 and 151-2, . . . , 151-$n$ and a frequency characteristic of the plurality of audio signals which are before being output from the post-processing unit 174. For example, the plurality of audio signals which are before being output from the post-processing unit 174 may be a plurality of audio signals after being subjected to signal processing via the DRC 203. In addition, in operation 1020, the electronic device may transmit a control signal so that the EQ 207 of the post-processing unit 174 performs frequency balancing, based on the aforementioned comparison. In this case, when the DRC 203 of the post-processing unit 174 processes an audio signal, it is possible to prevent a phenomenon in which the audio signal is distorted since energy of the audio signal is boosted to be concentrated on a higher frequency.

According to an embodiment of the disclosure, in operation 1020, the electronic device may identify whether the plurality of audio signals input from the plurality of microphones are abnormal. An example of the abnormal case may be a case where a magnitude of an audio signal is a very small value less than a pre-designated reference value. In operation 1030, the electronic device may bypass signal processing of the beamforming unit 175, based on identifying that some of the plurality of audio signals are abnormal.

An electronic device (e.g., the electronic device 101) according to various embodiments described above may include: a camera (e.g., the camera module 180); a plurality of microphones (e.g., the microphone array 151 or the plurality of microphones 151-1, 151-2, . . . , 151-$n$); and at least one processor (e.g., the processor 120) electrically coupled with the camera and the plurality of microphones. The at least one processor may acquire a video signal, based on a designated zoom level via the camera, acquire a plurality of audio signals respectively via the plurality of microphones while acquiring the video signal, identify a first signal characteristic of a first audio signal acquired via a first microphone and a second signal characteristic of a second audio signal acquired via a second microphone among the plurality of microphones, derive a control parameter for signal processing for the first audio signal and the second audio signal, based on the designated zoom level, the first signal characteristic, and the second signal characteristic, and perform audio signal processing including beamforming using the first audio signal and the second audio signal, based on the derived control parameter.

In various embodiments of the disclosure, the first signal characteristic may include a magnitude of the first audio signal. The second signal characteristic may include a magnitude of the second audio signal. The at least one processor may set an output amplification gain applied to the signal processing as a first level, if at least one of a magnitude of the first audio signal and a magnitude of the second audio signal exceeds a pre-set first threshold, and decrease the output amplification gain applied to the signal processing as a second level lower than the first level, if at least one of the magnitude of the first audio signal and the magnitude of the second audio signal exceeds a second threshold higher than the first threshold.

In various embodiments of the disclosure, the first signal characteristic may include a magnitude of the first audio signal. The second signal characteristic may include a magnitude of the second audio signal. The at least one processor may set a noise reduction level applied to the signal processing as a first level, if at least one of the magnitude of the first audio signal or the magnitude of the second audio signal exceeds a pre-set first threshold, and decrease the noise reduction level applied to the signal processing as a second level lower than the first level, if at least one of the magnitude of the first audio signal and the magnitude of the second audio signal exceeds a second threshold higher than the first threshold.

In various embodiments of the disclosure, the first signal characteristic may include a magnitude of the first audio signal. The second signal characteristic may include a magnitude of the second audio signal. The at least one processor may change a gain of a low cut filter applied to the signal processing, based on at least one of a magnitude of the first audio signal and a magnitude of the second audio signal.

In various embodiments of the disclosure, the signal processing may include a pre-processing process, a beamforming process, and a post-processing process for the plurality of audio signals.

In various embodiments of the disclosure, the at least one processor may determine an output amplification gain or beamforming effect level applied to the signal processing, based on a first SNR derived from the plurality of audio signals before the pre-processing process and a second SNR derived in the beamforming process.

In various embodiments of the disclosure, the at least one processor may apply the output amplification gain applied to the signal processing as a first level, if the second SNR exceeds a first value, and may apply the output amplification gain applied to the signal processing as a second level lower than the first level, if the second SNR is less than or equal to the first value.

In various embodiments of the disclosure, the at least one processor may apply a beamforming effect level applied to the signal processing as a first level, if the second SNR exceeds a first value, and may apply the beamforming effect level applied to the signal processing as a second level lower than the first level, if the second SNR is less than or equal to the first value.

In various embodiments of the disclosure, the first signal characteristic may include a frequency characteristic of the first audio signal. The second signal characteristic may include a frequency characteristic of the second audio signal. The at least one processor may perform frequency balancing signal processing by comparing a frequency characteristic of at least one of the first audio signal and the second audio signal and a frequency characteristic of the first audio signal or second audio signal to which an output amplification gain is applied during the signal processing.

In various embodiments of the disclosure, the first signal characteristic may include a magnitude of the first audio signal. The first audio signal may be identified as an abnormal signal, if the magnitude of the first audio signal is less than a pre-designated threshold value.

An electronic device (e.g., the electronic device 101) according to various embodiment described above may include: a camera (e.g., the camera module 180); a plurality of microphones (e.g., the microphone array 151 or the plurality of microphones 151-1, 151-2, . . . , 151-n); and at least one processor (e.g., the processor 120) electrically coupled with the camera and the plurality of microphones. The at least one processor may acquire a video signal, based on a designated zoom level via the camera, acquire a plurality of audio signals respectively via the plurality of microphones while acquiring the video signal, derive a control parameter for at least one of a beamforming effect, beam width, output amplification gain, noise reduction level, and filter gain applied to signal processing for the plurality of audio signal, based on the acquired video signal, at least one of a magnitude, frequency characteristic, SNR of each of the plurality of audio signals, and the designated zoom level, and perform audio signal processing including beamforming using the plurality of audio signals, based on the derived control parameter.

In various embodiments of the disclosure, the signal processing may include a pre-processing process, a beamforming process, and a post-processing process for the plurality of audio signals.

In various embodiments of the disclosure, the SNR may include a first SNR derived from the plurality of audio signals before the pre-processing process and a second SNR derived in the beamforming process.

A method of operating the electronic device according to various embodiments described above may include: acquiring a video signal, based on a designated zoom level via the camera; acquiring a plurality of audio signals respectively via the plurality of microphones while acquiring the video signal; identifying a first signal characteristic of a first audio signal acquired via a first microphone and a second signal characteristic of a second audio signal acquired via a second microphone among the plurality of microphones; deriving a control parameter for signal processing for the first audio signal and the second audio signal, based on the designated zoom level, the first signal characteristic, and the second signal characteristic; and performing audio signal processing including beamforming using the first audio signal and the second audio signal, based on the derived control parameter.

In various embodiments of the disclosure, the first signal characteristic may include a magnitude of the first audio signal. The second signal characteristic may include a magnitude of the second audio signal. An output amplification gain applied to the signal processing may be set as a first level, if at least one of the magnitude of the first audio signal and the magnitude of the second audio signal exceeds a pre-set first threshold. The output amplification gain applied to the signal processing may be decreased as a second level lower than the first level, if at least one of the magnitude of the first audio signal and the magnitude of the second audio signal exceeds a second threshold higher than the first threshold.

In various embodiments of the disclosure, the first signal characteristic may include a magnitude of the first audio signal. The second signal characteristic may include a magnitude of the second audio signal. A noise reduction level applied to the signal processing may be set as the first level, if at least one of the magnitude of the first audio signal and the magnitude of the second audio signal exceeds a pre-set first threshold. The noise reduction level applied to the signal processing may be decreased as a second level lower than the first level, if at least one of the magnitude of the first audio signal and the magnitude of the second audio signal exceeds a second threshold higher than the first threshold.

In various embodiments of the disclosure, the signal processing may include a pre-processing process, a beamforming process, and a post-processing process for the plurality of audio signals.

In various embodiments of the disclosure, an output amplification gain or beamforming effect level applied to the signal processing may be determined based on a first SNR derived from the plurality of audio signals before the pre-processing process and a second SNR derived in the beamforming process.

In various embodiments of the disclosure, the output amplification gain applied to the signal processing may be applied as a first level, if the second SNR exceeds a first value. The output amplification gain applied to the signal processing may be applied as a second level lower than the first level, if the second SNR is less than or equal to the first value.

In various embodiments of the disclosure, a beamforming effect level applied to the signal processing may be applied to a first level, if the second SNR exceeds a first value. The beamforming effect level applied to the signal processing may be applied to a second level lower than the first level, if the second SNR is less than or equal to the first value.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
 a camera;
 a plurality of microphones; and
 at least one processor electrically coupled with the camera and the plurality of microphones, wherein the at least one processor is configured to:
  acquire, via the camera, a video signal based on a designated zoom level,
  while acquiring the video signal, acquire, via the plurality of microphones, a plurality of audio signals, respectively,
  identify a first signal characteristic of a first audio signal acquired via a first microphone among the plurality of microphones and identify a second signal characteristic of a second audio signal acquired via a second microphone among the plurality of microphones,
  based on the designated zoom level, the first signal characteristic, and the second signal characteristic, derive a control parameter for signal processing for the first audio signal and the second audio signal, and
  based on the control parameter, perform audio signal processing comprising beamforming using the first audio signal and the second audio signal.

2. The electronic device of claim 1,
 wherein the first signal characteristic comprises a magnitude of the first audio signal,
 wherein the second signal characteristic comprises a magnitude of the second audio signal, and
 wherein the at least one processor is further configured to:
  in response to at least one of the magnitude of the first audio signal or the magnitude of the second audio signal exceeding a pre-set first threshold, set an output amplification gain applied to the signal processing at a first level, and
  in response to at least one of the magnitude of the first audio signal or the magnitude of the second audio signal exceeding a second threshold higher than the pre-set first threshold, decrease the output amplification gain applied to the signal processing to a second level lower than the first level.

3. The electronic device of claim 1,
 wherein the first signal characteristic comprises a magnitude of the first audio signal,
 wherein the second signal characteristic comprises a magnitude of the second audio signal, and
 wherein the at least one processor is further configured to:
  in response to at least one of the magnitude of the first audio signal or the magnitude of the second audio signal exceeding a pre-set first threshold, set a noise reduction level applied to the signal processing at a first level, and
  in response to at least one of the magnitude of the first audio signal or the magnitude of the second audio signal exceeding a second threshold higher than the pre-set first threshold, decrease the noise reduction level applied to the signal processing to a second level lower than the first level.

4. The electronic device of claim 1,
 wherein the first signal characteristic comprises a magnitude of the first audio signal,
 wherein the second signal characteristic comprises a magnitude of the second audio signal, and
 wherein the at least one processor is further configured to, based on at least one of the magnitude of the first audio signal or the magnitude of the second audio signal, change a gain of a low cut filter applied to the signal processing.

5. The electronic device of claim 1, wherein the signal processing comprises a pre-processing process, a beamforming process, and a post-processing process for the plurality of audio signals.

6. The electronic device of claim 5, wherein the at least one processor is further configured to, based on a first signal to noise ratio (SNR) derived from the plurality of audio signals before the pre-processing process and a second SNR derived in the beamforming process, determine an output amplification gain or a beamforming effect level applied to the signal processing.

7. The electronic device of claim 6, wherein the at least one processor is further configured to:
 in response to the second SNR exceeding a first value, apply the output amplification gain applied to the signal processing at a first level, and
 in response to the second SNR being less than or equal to the first value, apply the output amplification gain applied to the signal processing at a second level lower than the first level.

8. The electronic device of claim 6, wherein the at least one processor is further configured to:
 in response to the second SNR exceeding a first value, apply a beamforming effect level applied to the signal processing at a first level, and
 in response to the second SNR being less than or equal to the first value, apply the beamforming effect level applied to the signal processing at a second level lower than the first level.

9. The electronic device of claim 1,
 wherein the first signal characteristic comprises a frequency characteristic of the first audio signal,
 wherein the second signal characteristic comprises a frequency characteristic of the second audio signal, and
 wherein the at least one processor is further configured to perform frequency balancing signal processing by comparing the frequency characteristic of at least one of the first audio signal or the second audio signal and the frequency characteristic of the first audio signal or the second audio signal to which an output amplification gain is applied during the signal processing.

10. The electronic device of claim 1,
 wherein the first signal characteristic comprises a magnitude of the first audio signal, and
 wherein the at least one processor is further configured to, in response to the magnitude of the first audio signal being less than a pre-designated threshold value, identify the first audio signal as being an abnormal signal.

11. An electronic device comprising:
a camera;
a plurality of microphones; and
at least one processor electrically coupled with the camera and the plurality of microphones, wherein the at least one processor is configured to:
acquire, via the camera, a video signal based on a designated zoom level,
while acquiring the video signal, acquire, via the plurality of microphones, a plurality of audio signals, respectively,
based on the designated zoom level, the video signal, and at least one of a magnitude, a frequency characteristic, or a signal to noise ratio (SNR) of each of the plurality of audio signals, derive a control parameter for at least one of a beamforming effect, a beam width, an output amplification gain, a noise reduction level, or a filter gain applied to signal processing for the plurality of audio signals, and
based on the control parameter, perform audio signal processing comprising beamforming using the plurality of audio signals.

12. The electronic device of claim 11, wherein the signal processing comprises a pre-processing process, a beamforming process, and a post-processing process for the plurality of audio signals.

13. The electronic device of claim 12, wherein the SNR comprises a first SNR derived from the plurality of audio signals before the pre-processing process and a second SNR derived in the beamforming process.

14. A method of operating an electronic device, the method comprising:
acquiring, via a camera, a video signal based on a designated zoom level;
while acquiring the video signal, acquiring, via a plurality of microphones, a plurality of audio signals, respectively;
identifying a first signal characteristic of a first audio signal acquired via a first microphone among the plurality of microphones and identifying a second signal characteristic of a second audio signal acquired via a second microphone among the plurality of microphones;
based on the designated zoom level, the first signal characteristic, and the second signal characteristic, deriving a control parameter for signal processing for the first audio signal and the second audio signal; and
based on the control parameter, performing audio signal processing comprising beamforming using the first audio signal and the second audio signal.

15. The method of claim 14,
wherein the first signal characteristic comprises a magnitude of the first audio signal,
wherein the second signal characteristic comprises a magnitude of the second audio signal, and
wherein the method further comprises:
in response to at least one of the magnitude of the first audio signal or the magnitude of the second audio signal exceeding a pre-set first threshold, setting an output amplification gain applied to the signal processing at a first level; and
in response to at least one of the magnitude of the first audio signal or the magnitude of the second audio signal exceeding a second threshold higher than the pre-set first threshold, decreasing the output amplification gain applied to the signal processing to a second level lower than the first level.

16. The method of claim 14,
wherein the first signal characteristic comprises a magnitude of the first audio signal,
wherein the second signal characteristic comprises a magnitude of the second audio signal, and
wherein the method further comprises:
in response to at least one of the magnitude of the first audio signal or the magnitude of the second audio signal exceeding a pre-set first threshold, setting a noise reduction level applied to the signal processing at a first level; and
in response to at least one of the magnitude of the first audio signal or the magnitude of the second audio signal exceeding a second threshold higher than the pre-set first threshold, decreasing the noise reduction level applied to the signal processing to a second level lower than the first level.

17. The method of claim 14, further comprising:
based on at least one of a magnitude of the first audio signal or a magnitude of the second audio signal, changing a gain of a low cut filter applied to the signal processing,
wherein the first signal characteristic comprises the magnitude of the first audio signal, and
wherein the second signal characteristic comprises the magnitude of the second audio signal.

18. The method of claim 14,
wherein the first signal characteristic comprises a magnitude of the first audio signal, and
wherein the method further comprises, in response to the magnitude of the first audio signal being less than a pre-designated threshold value, identifying the first audio signal as being an abnormal signal.

19. The method of claim 14, wherein the signal processing comprises a pre-processing process, a beamforming process, and a post-processing process for the plurality of audio signals.

20. The method of claim 19, further comprising, based on a first signal to noise ratio (SNR) derived from the plurality of audio signals before the pre-processing process and a second SNR derived in the beamforming process, determining an output amplification gain or beamforming effect level applied to the signal processing.

21. The method of claim 20, further comprising:
in response to the second SNR exceeding a first value, applying the output amplification gain applied to the signal processing at a first level; and
in response to the second SNR being less than or equal to the first value, applying the output amplification gain applied to the signal processing at a second level lower than the first level.

22. The method of claim 20, further comprising:
in response to the second SNR exceeding a first value, applying a beamforming effect level applied to the signal processing at a first level; and
in response to the second SNR being less than or equal to the first value, applying the beamforming effect level applied to the signal processing at a second level lower than the first level.

* * * * *